United States Patent
Choi et al.

(10) Patent No.: US 8,476,908 B2
(45) Date of Patent: Jul. 2, 2013

(54) SIGNAL CAPTURE SYSTEM AND TEST APPARATUS INCLUDING THE SAME

(75) Inventors: Woon-sup Choi, Cheonan-si (KR); Ho-sun Yoo, Seongnam-si (KR); In-su Yang, Seongnam-si (KR); Min-sung Kim, Seoul (KR); Jong-pill Park, Suwon-si (KR); In-ho Choi, Yongin-si (KR); Sung-yeol Kim, Yongin-si (KR); Jeong-gon Lee, Seoul (KR); Seung-jun Chee, Seoul (KR); Jae-il Lee, Yongin-si (KR); Chul-woong Jang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 393 days.

(21) Appl. No.: 12/840,573

(22) Filed: Jul. 21, 2010

(65) Prior Publication Data

US 2011/0109318 A1    May 12, 2011

(30) Foreign Application Priority Data

Nov. 9, 2009 (KR) .......................... 10-2009-0107516

(51) Int. Cl.
*G01R 31/02* (2006.01)
*G01R 31/00* (2006.01)

(52) U.S. Cl.
USPC ...................................... 324/537; 324/754.18

(58) Field of Classification Search
USPC ................................................. 324/537, 500
See application file for complete search history.

(56) References Cited

U.S. PATENT DOCUMENTS

| | | | |
|---|---|---|---|
| 8,058,887 B2 * | 11/2011 | Tunaboylu | 324/754.18 |
| 2008/0309349 A1 * | 12/2008 | Sutono | 324/537 |
| 2010/0171508 A1 * | 7/2010 | Shelsky et al. | 324/537 |

FOREIGN PATENT DOCUMENTS

| | | |
|---|---|---|
| JP | 2005-283467 A | 10/2005 |
| JP | 2009-063567 A | 3/2009 |
| KR | 10-0885053 A | 1/2009 |

* cited by examiner

*Primary Examiner* — Hoai-An D Nguyen
(74) *Attorney, Agent, or Firm* — Harness, Dickey & Pierce, P.L.C.

(57) ABSTRACT

A signal capture system for capturing a signal and storing the captured signal in a storage apparatus in real time, and a test apparatus including the signal capture system. The signal capture system includes a printed circuit board; a socket that is connected to the printed circuit board and on which a reference memory component is mounted; and an interposer that is mounted on the printed circuit board, is connected to the socket, an external apparatus, and a storage apparatus, receives first signals from the reference memory component and transmits the received first signals to the external apparatus and the storage apparatus, and receives second signals from the external apparatus and transmits the received second signals to the reference memory component and the storage apparatus, wherein a shape of the socket is defined according to a type of the reference memory component.

15 Claims, 8 Drawing Sheets

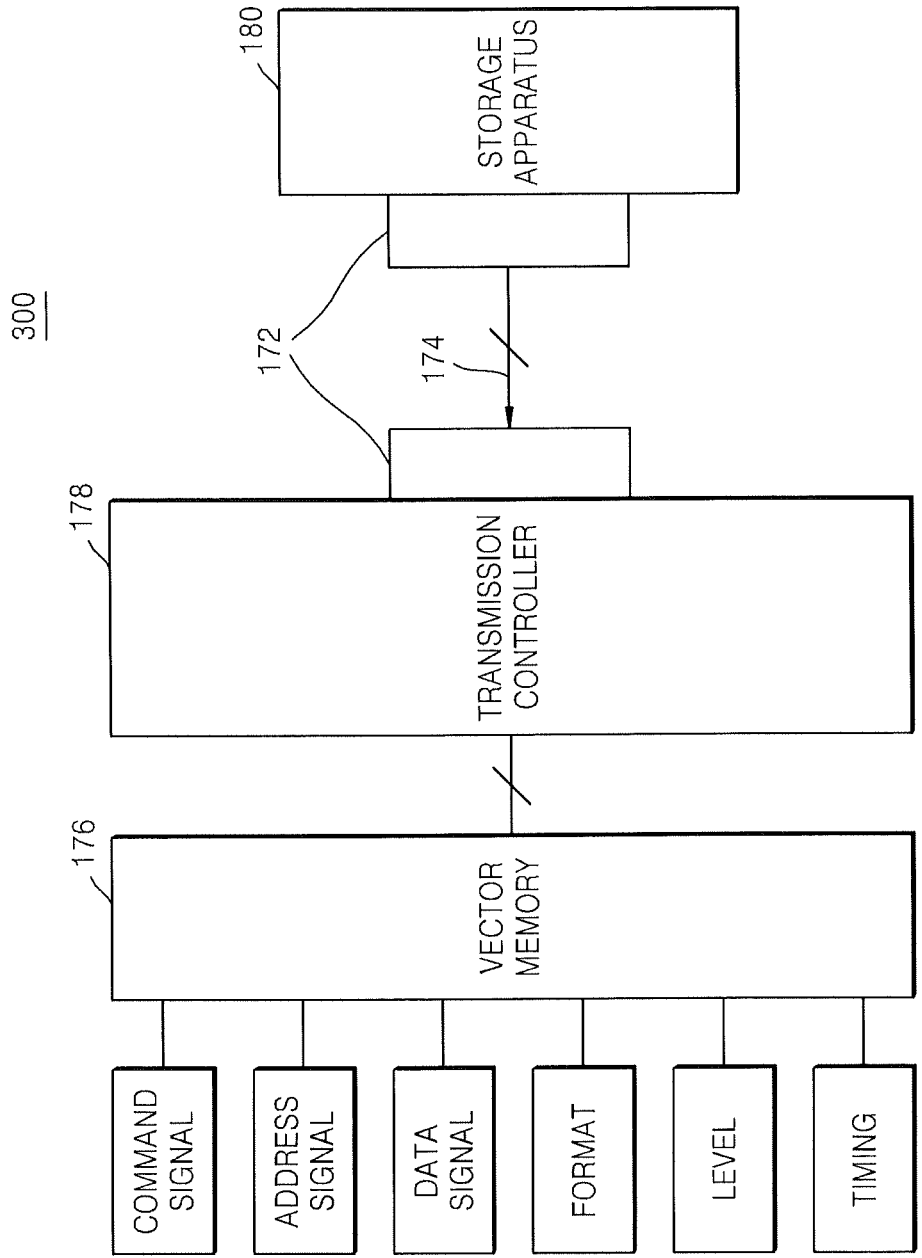

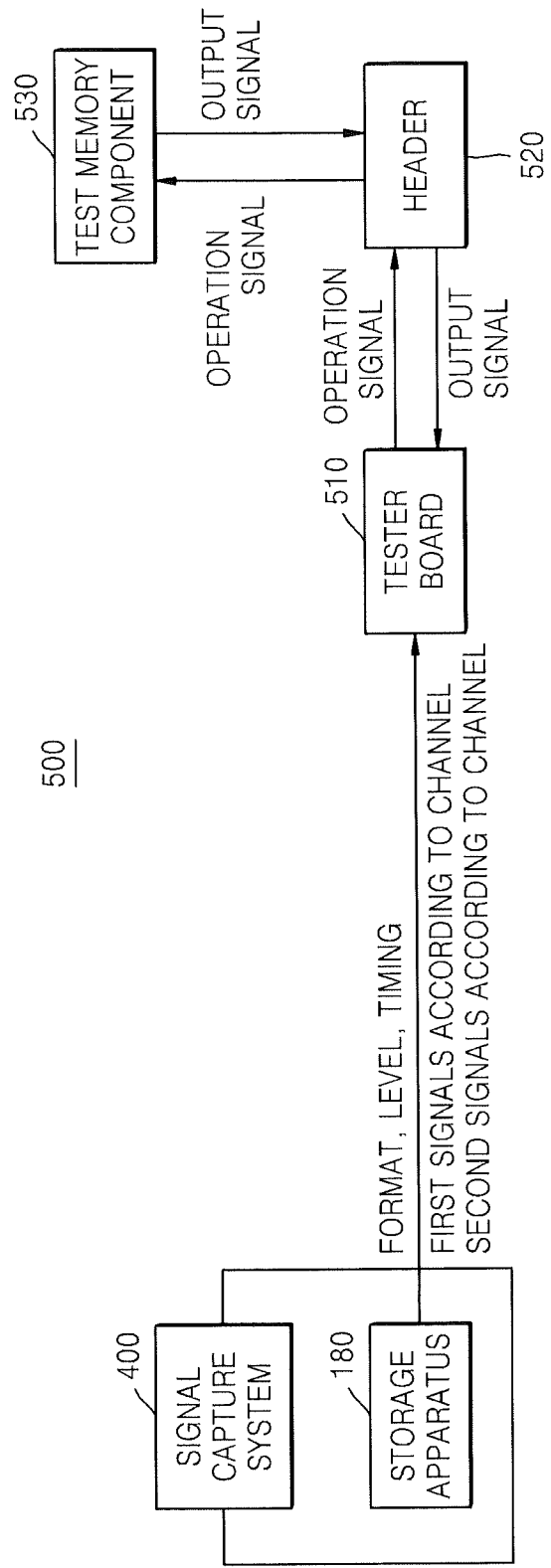

SIGNAL CAPTURE SYSTEM AND TEST APPARATUS INCLUDING THE SAME

CROSS-REFERENCE TO RELATED APPLICATIONS

This application claims priority under 35 U.S.C. §119 to Korean Patent Application No. 10-2009-0107516, filed on Nov. 9, 2009, in the Korean Intellectual Property Office (KIPO), the entire contents of which are incorporated herein by reference.

BACKGROUND

1. Field

Example embodiments relates to a signal capture system and a test apparatus, and more particularly, to a signal capture system for capturing a signal and storing the captured signal in a storage apparatus in real time, and a test apparatus including the signal capture system.

2. Related Art

When a memory device is manufactured, a memory component manufactured through a predetermined assembly process is tested in order to check whether a certain function is operable. A test apparatus tests the memory component by generating logic data of the memory component according to a programmed operation, generating an operation signal including the logic data, and sending the operation signal to the memory component.

SUMMARY

Example embodiments provide a signal capture system for mounting different types of memory components.

Example embodiments also provide a test apparatus for performing a test operation without creating an actual mounting environment, by capturing a signal and storing the captured signal in a storage apparatus in real time by using the signal capture system.

According to at least one example embodiment, there is provided a signal capture system including a printed circuit board; a socket that is connected to the printed circuit board and on which a reference memory component is mounted; and an interposer that is mounted on the printed circuit board, is connected to the socket, an external apparatus, and a storage apparatus, receives first signals from the reference memory component and transmits the received first signals to the external apparatus and the storage apparatus, and receives second signals from the external apparatus and transmits the received second signals to the reference memory component and the storage apparatus, wherein a shape of the socket is defined according to a type of the reference memory component.

The external apparatus may include a mother board or a customer end (CE) device.

The signal capture system may further include: a separator for separating according to a channel the first signals and the second signals that are refined; and the storage apparatus for storing according to a channel the first signals and the second signals that are separated according to a channel, wherein the separator may be connected between the interposer and the storage apparatus.

The signal capture system may further include: a refiner for removing noise from the first signals and the second signals; and an amplifier for amplifying the first signals and the second signals from which the noises are removed, wherein the refiner and the amplifier may be connected between the interposer and the separator.

According to another example embodiment, there is provided a signal capture system including a printed circuit board; a socket that is connected to the printed circuit board; a reference memory component mounted on the socket for storing a data signal according to an address signal is mounted; an interposer that is mounted on the printed circuit board, and an external apparatus that is connected to the interposer and generates a control signal for controlling the reference memory component to read the data signal stored according to the address signal, or store the data signal in the reference memory component according to the address signal, wherein the interposer transmits the address signal and the data signal from the reference memory component to a storage apparatus, and transmits the control signal from the external apparatus to the storage apparatus, and wherein a shape of the socket is defined according to a type of the reference memory component.

The external apparatus may be a mother board, and the printed circuit board may be mounted on the mother board.

The external apparatus may be a CE device, and the socket may be mounted on the CE device.

The printed circuit board may be a flexible printed circuit board.

The signal capture system may further include a separator that is connected between the interposer and the storage apparatus, and separates the address signal, the data signal, and the control signal according to a channel.

The signal capture system may further include the storage apparatus that is connected to the separator and stores the address signal, the data signal, and the control signal that are separated according to a channel.

The signal capture system may further include a transmitter connected between the separator and the storage apparatus.

The transmitter may include at least one pair of general packet ratio service (GPRS) tunneling protocol (GTP) connectors for transmitting a signal through a protocol defined in a GPRS network; and an optical cable connecting the at least one pair of GTP connectors to one another.

The signal capture system may further include a refiner for removing noise from the address signal the data signal, and the control signal; and an amplifier for amplifying the address signal, the data signal, and the control signal from which the noise is removed, wherein the refiner and the amplifier may be connected between the interposer and the separator.

The separator may include a signal information separator for separating a format, a level, and a timing of the address signal, the data signal, and the control signal; and a demultiplexer for separating inputs according to a channel along a selection line, wherein the inputs include the address signal, the data signal, and the control signal, wherein the storage apparatus may store the format, the level, the timing, the address signal, the data signal, and the control signal, which are separated according to the channel.

According to another aspect of example embodiments, there is provided a test apparatus including a signal capture system including a separator for receiving and separating according to a channel first signals generated by a reference memory component and second signals generated by an external apparatus; and a storage apparatus that is connected to the separator and stores the first signals and the second signals separated according to a channel.

The test apparatus may further include a tester board for receiving the first signals and the second signals stored in the storage apparatus according to a channel, and generating an operation signal by combining the first signals and the second signals as a group; and a header for applying the operation signal to a test memory component by receiving the operation signal from the tester board, and receiving an output signal processed by the test memory component, wherein the tester board receives the output signal from the header, and determines whether an operation of the test memory component is normal by comparing the output signal with the first signals and the second signals.

The first signal may include an address signal and a data signal of the reference memory component.

The second signal may include a control signal of the external apparatus.

The separator may include a signal information separator for separating a format, a level, and a timing of the address signal, the data signal, and the control signal; and a demultiplexer for separating inputs according to a channel along a selection line, wherein the inputs include the address signal, the data signal, and the control signal, wherein the storage apparatus may store the format, the level, the timing, the address signal, the data signal, and the control signal, which are separated according to the channel.

The test apparatus may further include a tester board for receiving the format, the level, the timing, the address signal, the data signal, and the control signal stored according to the channel from the storage apparatus, and generating an operation signal by combining the address signal, the data signal, and the control signal as a group based on the format, the level, and the timing; and a header for applying the operation signal to the test memory component by receiving the operation signal from the tester board, and receives an output signal processed by the test memory component, wherein the tester board may receive the output signal from the header, and determine whether an operation of the test memory component is normal by comparing the output signal with the address signal, the data signal, and the control signal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 9 is a block diagram illustrating in detail a transmitter of FIG. 7; and

FIG. 10 is a block diagram schematically illustrating a test apparatus according to an example embodiment of.

DETAILED DESCRIPTION OF THE EMBODIMENTS

Figure 1:
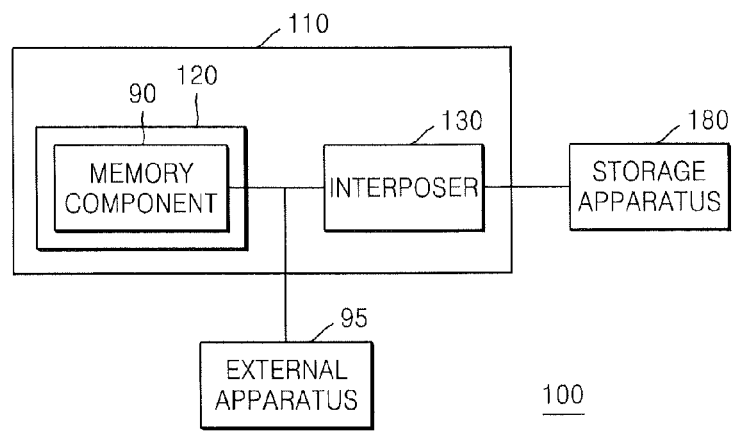
FIG. 1 is a block diagram schematically illustrating a signal capture system according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram schematically illustrating a signal capture system 100 according to an example embodiment.

Referring to FIG. 1, the signal capture system 100 includes a printed circuit board 110, a socket 120, an interposer 130, and a storage apparatus 180. The signal capture system 100 may further include a reference memory component 90 and an external apparatus 95.

The reference memory component 90 may be a product manufactured by performing an assembly process, such as packaging, on a semiconductor device. The reference memory component 90 may communicate a signal with external apparatuses via a conductor, such as a pin. The reference memory component 90 has excellent characteristics, and is used to determine the quality of a test memory component 530 of FIG. 10 which will be discussed in greater detail below.

The reference memory component 90 may be a volatile memory device, including for example a static random access memory (SRAM), a dynamic random access memory (DRAM), or a synchronous dynamic random access memory (SDRAM), or a nonvolatile memory device, including for example a read only memory (ROM), a programmable read only memory (PROM), an erasable programmable read only memory (EPROM), an electrically erasable programmable read only memory (EEPROM), a flash memory, a phase-change random access memory (PRAM), a magnetic random access memory (MRAM), a resistive random access memory (RRAM), or a ferroelectric random access memory (FRAM). In other words, the reference memory component 90 may store a data signal in the memory device according to an address signal, or output a data signal stored in the memory device according to an address signal.

However, the reference memory component 90 is not limited to the memory device, and may be other products to be compared with a test product. The product may be a combination of memory components such as a memory module, a memory card, or a memory stick. Alternatively, the product may be a chip, including for example an image signal processor (ISP) or a digital signal processor (DSP) that includes or does not include a memory device.

Figure 2:
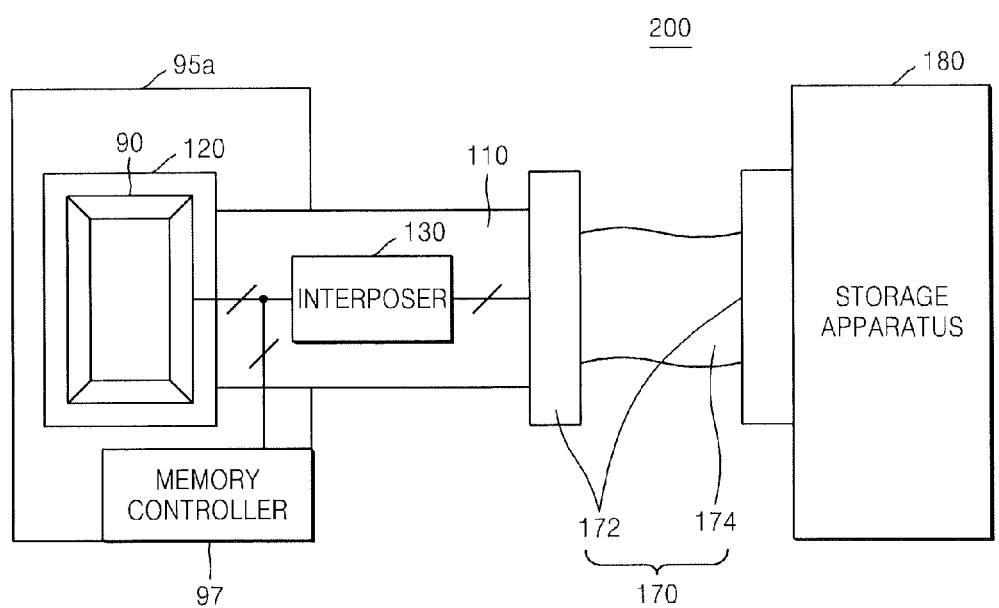
FIG. 2 is a plan view schematically illustrating a signal capture system according to an example embodiment.

The reference memory component 90 may be mounted on the socket 120, and the socket 120 may be connected to the printed circuit board 110. The socket 120 may be mounted on the printed circuit board 110 or directly mounted on a customer end (CE) device 95a as illustrated in FIG. 2 which will be discussed in greater detail below. A type of the socket 120 may be determined according to a type of the reference memory component 90. For example, according to the Joint Electron Device Engineering Council (JEDEC) standard, when an SDRAM is mounted on the socket 120, the socket 120 may have 68 pins, and when a DDR SDRAM is mounted on the socket 120, the socket 120 may have 184 pins. Accordingly, even when the reference memory component 90 is of a different type, a test may be performed without having to design a new signal capture system.

Figure 4:
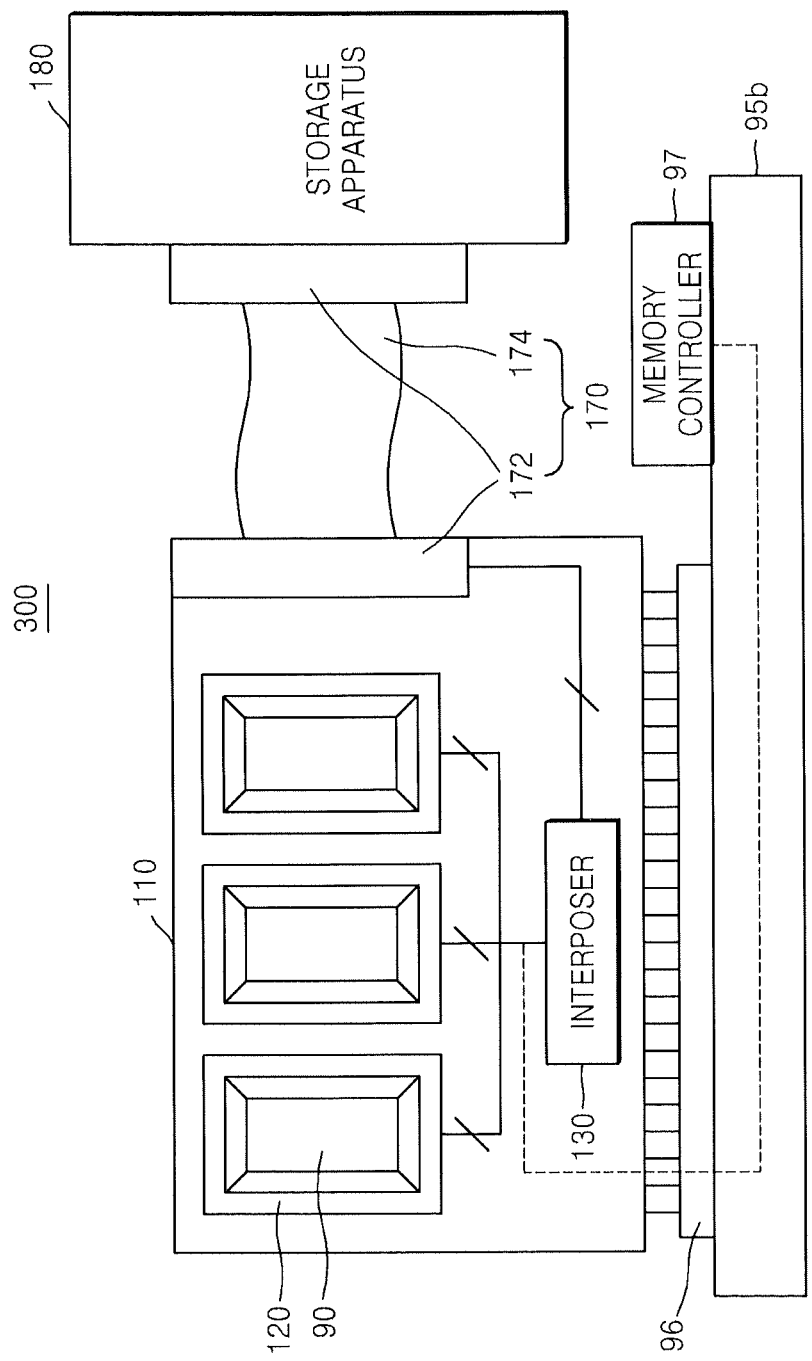
FIG. 4 is a front view schematically illustrating a signal capture system according to an example embodiment.

The external apparatus 95 is an apparatus on which a processor for communicating a signal with the reference memory component 90 is mounted. In detail, the external apparatus 95 may generate a control signal for the reference memory component 90 to read a stored data signal according to an address signal, or to store a data signal in the reference memory component 90 according to an address signal. The external apparatus 95 may include the CE device 95a as illustrated in FIG. 2 or a mother board 95b as illustrated in FIG. 4 which will be discussed in greater detail below.

The interposer 130 is mounted on the printed circuit board 110, and connected to the socket 120 and the external apparatus 95 so as to capture signals between the reference memory component 90 and the external apparatus 95. Also, the interposer 130 is connected to the storage apparatus 180 so as to transmit the signals to the storage apparatus 180. In detail, the interposer 130 may receive first signals from the reference memory component 90 and transmit the received first signals to the external apparatus 95 and the storage apparatus 180, and receive second signals from the external apparatus 95 and transmit the received second signals to the reference memory component 90 and the storage apparatus 180. The first signal may be an address signal and a data signal output by the reference memory component 90, and the second signal may be a control signal output by the external apparatus 95. The first and second signals are signals in an application environment, and may include logic signals, such as the address signal, the data signal, and the control signal, signal integrity information, power integrity information, an operation temperature, a temperature noise, and electromagnetic interference (EMI) information.

Figure 3:
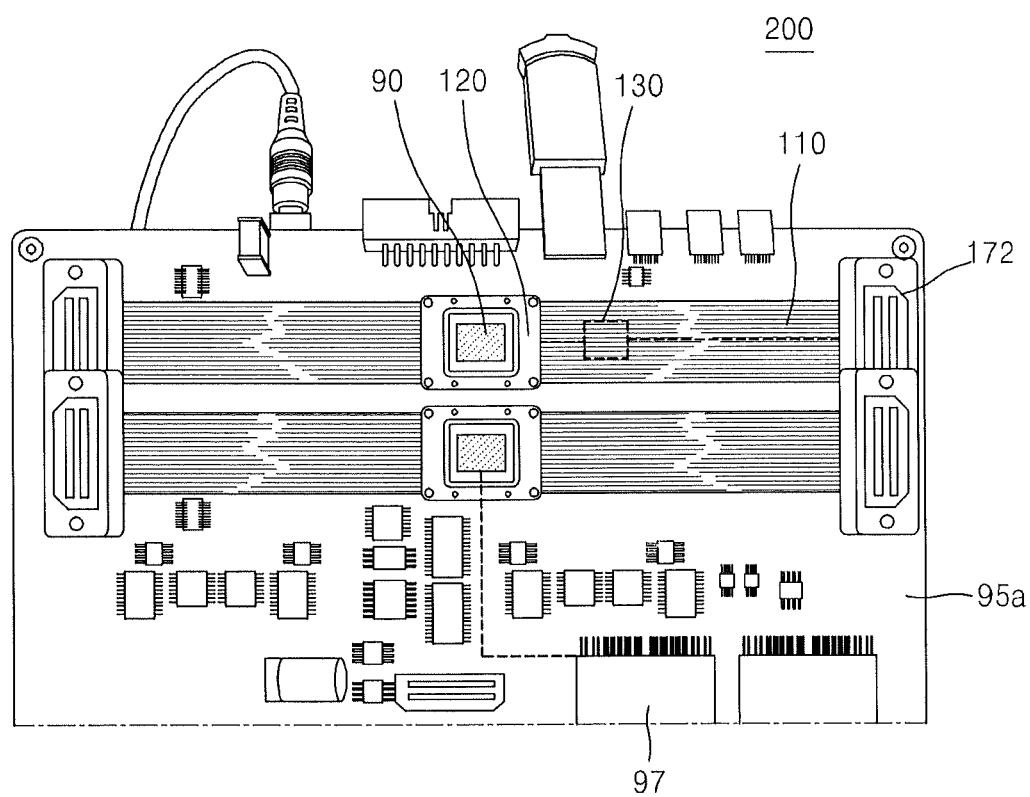
FIG. 3 is a perspective view schematically illustrating the signal capture system of FIG. 2.

FIGS. 2 and 3 are respectively a plan view and a perspective view schematically illustrating a signal capture system 200 according to an example embodiment. The signal capture system 200 according to the current example embodiment may be a modified example of the signal capture system 100 according to the previous example embodiment discussed above with reference to FIG. 1. Accordingly, overlapping descriptions are not repeated.

Referring to FIGS. 2 and 3, the signal capture system 200 may connect a memory controller 97 inside the CE device 95a, which is an example of the external apparatus 95 of FIG. 1 and uses the reference memory component 90, to the storage apparatus 180. Accordingly, the signal capture system 200 may receive signals from the reference memory component 90 and the memory controller 97, and transmit the received signals to the storage apparatus 180. The memory controller 97 may generate a control signal for the reference memory component 90 to read a stored data signal according to an address signal, or store the data signal in the reference memory component 90 according to the address signal. The CE device 95a is a product including a memory, and may be, for example, a printer, a cell phone, a digital camera, a portable multimedia player (PMP), a personal digital assistant (PDA), or a smart phone.

The reference memory component 90 may be mounted on the socket 120. The socket 120 is mounted on the CE device 95a, and the reference memory component 90 and the CE device 95a may be connected through the socket 120. As described above, the shape of the socket 120 may be determined according to the type of the reference memory component 90.

The printed circuit board 110 may be connected to the socket 120 and the memory controller 97. In detail, the interposer mounted on the printed circuit board 110 may be connected to the socket 120 and the memory controller 97. The printed circuit board 110 may be a flexible printed circuit board. The CE device 95a is small because its mobility is considered important, so it is difficult to be connected to the signal capture system 200. Accordingly, the signal capture system 200 using a flexible printed circuit board is connected to the CE device 95a, thereby overcoming a spatial restriction.

The interposer 130 is mounted on the printed circuit board 110, and connected to the socket 120 and the CE device 95a, thereby capturing signals between the reference memory component 90 and the CE device 95a. In detail, the interposer 130 captures an address signal and a data signal of the reference memory component 90, and a control signal of the memory controller 97, and transmits the captured address signal, the data signal, and the control signal to the storage apparatus 180. Alternatively, the interposer 130 may transmit the address signal and the data signal from the reference memory component 90 to the storage apparatus 180, and transmit the control signal from the memory controller 97 to the reference memory component 90. In brief, the interposer 130 connects the reference memory component 90 and the memory controller 97 for signal communication, for capturing and transmitting the address signal, the data signal, and the control signal to the storage apparatus 180.

A transmitter 170 may connect the interposer 130 and the storage apparatus 180, and may transmit the address signal, the data signal, and the control signal from the interposer 130 to the storage apparatus 180. The transmitter 170 may include an optical cable 174 that connects at least a pair of connectors 172 to one another. The at least a pair of connectors 172 may be general packet radio service (GPRS) tunneling protocol (GTP) connectors for transmitting a signal through a protocol defined in a GPRS network. Although not illustrated in FIGS. 2 and 3, a refiner, an amplifier, and a separator which respectively refines, amplifies, and separates the address signal, the data signal, and the control signal may be connected between the at least a pair of connectors 172 and the interposer 130.

Figure 5:
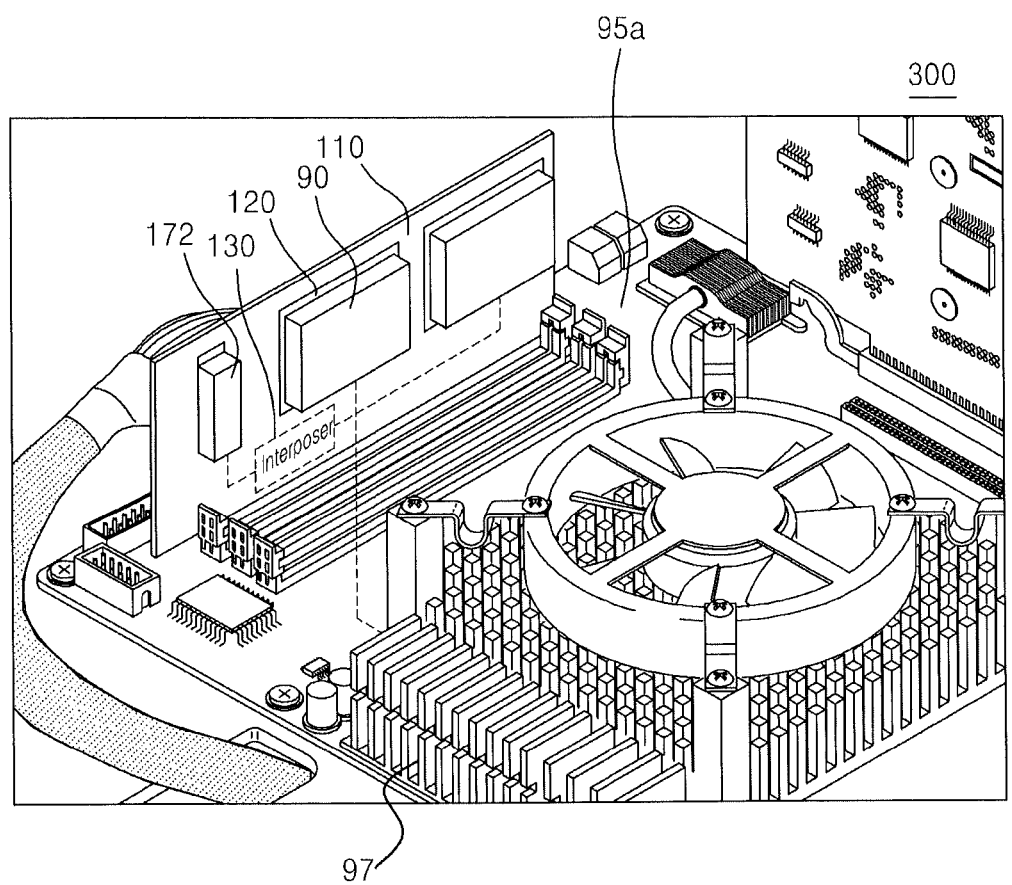
FIG. 5 is a perspective view schematically illustrating the signal capture system of FIG. 4.

FIGS. 4 and 5 are respectively a front view and a perspective view schematically illustrating a signal capture system 300 according to an example embodiment. The signal capture system 300 according to the current example embodiment may be a modified example of the signal capture system 200 according to the previous example embodiment described above with reference to FIGS. 2 and 3. Accordingly, overlapping descriptions are not repeated.

Referring to FIGS. 4 and 5, the signal capture system 300 may be mounted on the mother board 95b, which is an example of the external apparatus 95 of FIG. 1 used in a computer. In detail, the printed circuit board 110 of the signal capture system 300 may be mounted on a mounting unit 96 of the mother board 95b. The signal capture system 300 may be connected between the memory controller 97 in the mother board 95b using the reference memory component 90, and the storage apparatus 180, and may receive signals of the memory controller 97 and the reference memory component 90 and transmit the received signals to the storage apparatus 180. The memory controller 97 may be a memory controller hub (MCH) connected to a central processing unit (CPU). The CPU may be a unit for a server, a desk top, a lap top, or a net book.

The reference memory component 90 may be mounted on the socket 120. As discussed previously, the shape of the socket 120 may be determined according to the type of the reference memory component 90. The socket 120 may be mounted on the printed circuit board 110. Since the socket 120, on which various types of reference memory component 90 may be mounted, is mounted on the printed circuit board 110, mounting various types of commercial module RAM may be realized in one printed circuit board 110. The reference memory component 90 and the printed circuit board 110 may be connected through the socket 120. By mounting the printed circuit board 110 on the mounting board 96 of the mother board 95b, the printed circuit board 110 may be connected to the socket 120 and the memory controller 97.

The interposer 130 may be mounted on the printed circuit board 110. The interposer 130 is connected to the socket 120 and the memory controller 97 of the mother board 95b, thereby capturing signals between the reference memory component 90 and the memory controller 97. As described above, the interposer 130 connects the reference memory component 90 and the memory controller 97 for communicating a signal, and captures and transmits the signal to the storage apparatus 180.

Figure 6:
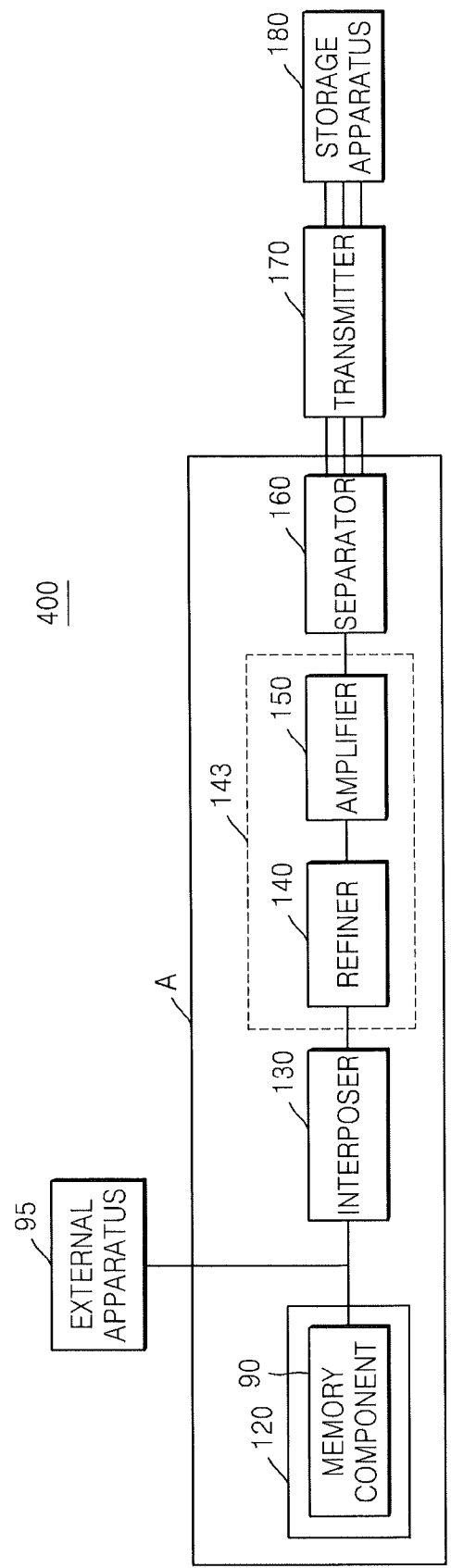
FIG. 6 is a block diagram schematically illustrating a signal capture system according to an example embodiment.

FIG. 6 is a block diagram schematically illustrating a signal capture system 400 according to an example embodiment. The signal capture system 400 may be a modified example of the signal capture system 100 according to the example embodiment described above with reference to FIG. 1. Accordingly, overlapping descriptions are not repeated.

Referring to FIG. 6, the signal capture system 400 may include the printed circuit board 110, the socket 120, the interposer 130, a refiner 140, an amplifier 150, a separator 160, the transmitter 170, and the storage apparatus 180. The signal capture system 400 may further include the reference memory component 90 and the external apparatus 95.

The refiner 140, the amplifier 150, the separator 160, and the transmitter 170 are sequentially connected in the stated order between the interposer 130 and the storage apparatus 180, and may respectively refine, amplify, separate, and transmit first signals of the reference memory component 90 and second signals of the external apparatus 95, wherein the first and second signals are transmitted by the interposer 130. The first signals include an address signal and a data signal of the reference memory component 90, and the second signals include a control signal of the external apparatus 95. However, as described above, the first and second signals are not limited to the address signal, the data signal, and the control signal.

The refiner 140 is connected between the interposer 130 and the amplifier 150, and may remove noise from the first signals generated by the reference memory component 90 and the second signals generated by the external apparatus 95. For example, the refiner 140 may remove noise from the address signal and the data signal generated by the reference memory component 90, and the control signal generated by the external apparatus 95.

The amplifier 150 is connected between the refiner 140 and the separator 160, and may amplify the noise-removed first signals and the noise-removed second signals. For example, the amplifier 150 may amplify the address signal and the data signal generated by the reference memory component 90 and the control signal generated by the external apparatus 95 5 times so as to classify a signal in a logic high level and a signal in a logic low level.

Selectively, the refiner 140 and the amplifier 150 may be realized in an active device. Also selectively, matching units may be inserted between the interposer 130 and the refiner 140, between the refiner 140 and the amplifier 150, and between the amplifier 150 and the separator 160, in order to prevent the first and second signals from being reflected due to an impedance difference.

Figure 7:
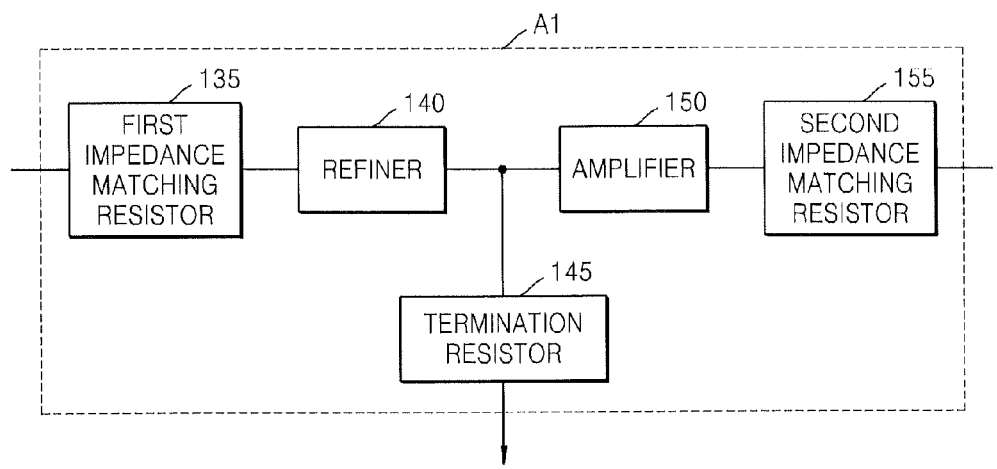
FIG. 7 is a block diagram of a modified example of block A in FIG. 6.

FIG. 7 is a block diagram of a modified example of a block indicated by A in FIG. 6.

As shown in a block A1, a first impedance matching resistor 135 may be connected between the interposer 130 and the refiner 140, and a second impedance matching resistor 155 may be connected between the amplifier 150 and the separator 160. Also, a termination resistor 145 may be connected between a ground and a node between the refiner 140 and the amplifier 150.

Noise of a signal is removed by using the refiner 150, and then a level decrease of the signal is compensated for by amplifying the signal by using the amplifier 150. Accordingly, the signal is prevented from being incorrectly recognized due to the level decrease and noise. Also, by using the matching units, the signal is prevented from being incorrectly recognized due to wrong impedance matching, while capturing the signal.

Figure 8:
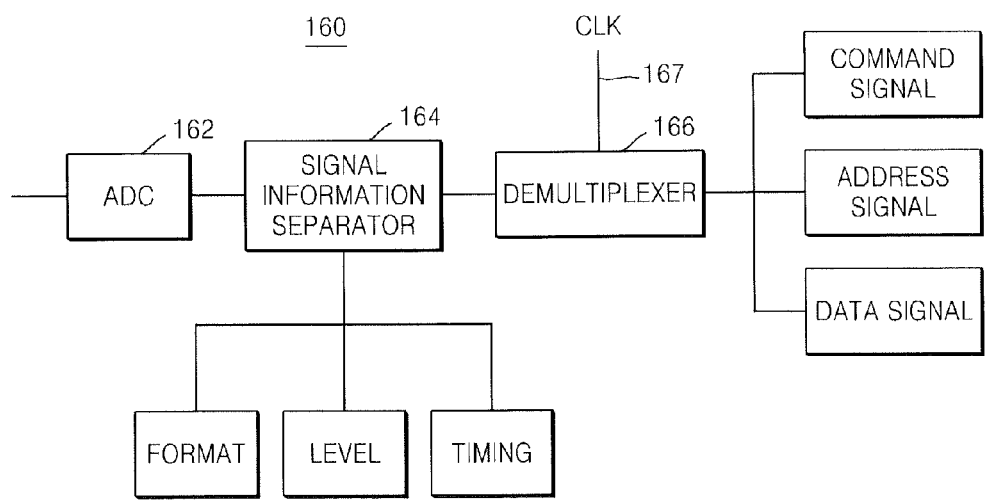
FIG. 8 is a block diagram illustrating in detail a separator of FIG. 6.

FIG. 8 is a block diagram illustrating in detail the separator 160 of FIG. 6.

Referring to FIGS. 6 and 8, the separator 160 is connected between the amplifier 150 and the transmitter 170, and may separate first signals generated by the reference memory component 90 and second signals generated by the external apparatus 95 according to a channel. In detail, the separator 160 may separate an address signal and a data signal of the reference memory component 90, and a control signal of the external apparatus 95 according to a channel, wherein noise is removed from the address signal, the data signal, and the control signal and then the address signal, the data signal, and the control signal are amplified.

The separator 160 may include an analog digital converter (ADC) 162, a signal information separator 164, and a demultiplexer 166. The ADC 162 may convert the first and second signals, which are amplified analog signals, into digital signals. The signal information separator 164 may separate a format, a level, and a timing of the first and second signals. In FIG. 8, the ADC 162, the signal information separator 164, and the demultipleer 166 are sequentially connected in the stated order, but they may be connected differently. For example, the ADC 162 may be connected between the signal information separator 164 and the demultipleer 166.

The demultiplexer 166 may separate inputs according to a channel along a selection line 167, wherein the first and second signals are the inputs. In order to separate the inputs according to a channel, a clock signal CLK for operating the reference memory component 90 may be applied to the selection line 167. Accordingly, a combination of the first and second signals that are grouped and synchronized with the clock signal CLK may be separated according to a channel along the selection line 167. For example, the demultiplexer 166 may sequentially separate a combination of a command signal, an address signal, and a data signal that are grouped and synchronized with the clock signal CLK, according to the clock signal CLK applied to the selection line 167, i.e., according to a channel.

The format, the level, and the timing separated by the signal infoiination separator 164 may be transmitted to the transmitter 170. Similarly, the command signal, the address signal, and the data signal separated by the demultiplexer 166 may be transmitted to the transmitter 170.

FIG. 9 is a block diagram illustrating in detail the transmitter 170 of FIG. 7.

Referring to FIGS. 6 and 9, the transmitter 170 is connected between the separator 160 and the storage apparatus 180, and may transmit first signals of the reference memory component 90 and second signals of the external apparatus 95, wherein the first and second signals are separated according to a channel, to the storage apparatus 180. In detail, the transmitter 170 may transmit an address signal and a data signal of the reference memory component 90, and a control signal of the external apparatus 95, wherein the address signal, the data signal, and the control signal are separated according to a channel, to the storage apparatus 180. As described with reference to FIG. 2, the transmitter 170 may include at least a pair of connectors 172 and the optical cable 174.

Selectively, the transmitter 170 may transmit a format, a level, and a timing of the first and second signals to the storage apparatus 180. The first and second signals separated according to a channel, the format, the level, and the timing may be temporarily stored in a vector memory 176. The transmitter 170 may transmit the first and second signals, the format, the level, and the timing stored in the vector memory 176 to the storage apparatus 180 according to a command of a transmission controller 178.

The storage apparatus 180 may store the format, the level, the timing, the address signal, the data signal, and the control signal, wherein the address signal, the data signal, and the control signal are separated according to a channel, received from the transmitter 170. The storage apparatus 180 is a database including a mass storage apparatus, and may store signals captured from reference memory component 90, the CE device 95a, or the mother board 95b and transmitted by the transmitter 170.

The signals stored according to a channel in the storage apparatus 180 may be processed by a user. In other words, the user may not store an undesired signal, or may amend the undesired signal. For example, the user may remove an unnecessary temperature noise or EMI from among items forming a signal, or may add or change a logic signal, such as an address signal, a data signal, or a control signal. Also if required, the user may check problems regarding an actual environment while capturing a signal.

FIG. 10 is a block diagram schematically illustrating a test apparatus 500 according to an example embodiment of. The test apparatus 500 according to the current embodiment of may include the signal capture system 400 of FIG. 6. However, the test apparatus 500 may also include any one of the signal capture systems 100, 200, and 300 according to the previous embodiments discussed above with reference to FIGS. 1-4. In other words, the test apparatus 500 may include a signal capture system according to example embodiments. Overlapping descriptions will not be repeated herein.

Referring to FIG. 10, the test apparatus 500 may include the signal capture system 400 of FIG. 6, a tester board 510, and a header 520. Also, the test apparatus 500 may further include a test memory component 530 on which a test is to be performed.

The tester board 510 may receive first signals from the reference memory component 90 and second signals from the external apparatus 95 from the storage apparatus 180, in which the first and second signals are stored according to a channel. In detail, the tester board 510 may receive an address signal and a data signal from the reference memory component 90, and a control signal from the external apparatus 95 from the storage apparatus 180, in which the address signal, the data signal, and the control signal are stored according to a channel. Also, the tester board 510 may receive a format, a level, and a timing of the first and second signals, such as the address signal, the data signal, and the control signal.

The tester board 510 may generate an operation signal by combining the first and second signals as a group. In detail, the tester board 510 may generate an operation signal by combining the address signal, the data signal, and the control signal as a group, based on the format, the level, and the timing.

The header 520 may receive the operation signal from the tester board 510, and apply the operation signal to the test memory component 530. Also, the header 520 may receive an output signal processed by the test memory component 530, and transmit the output signal to the tester board 510.

The tester board 510 receives the output signal from the header 520, and may determine whether an operation of the test memory component 530 is normal by comparing the output signal with the first and second signals. In detail, the tester board 510 compares the output signal with the address signal, the data signal, and the control signal so as to determine whether the operation of the test memory component 530 is normal.

Since the operation signal is applied to the test memory component 530 by processing a signal stored in the storage apparatus 180 through capturing, a test may be performed without creating an actual mounting environment. In other words, a copy of the real mounting environment is possible. Accordingly, by capturing and storing a signal that may be tested in an actual environment, the test memory component 530 may be tested at a desired time without using the CE device 95a or the mother board 95b.

Moreover, since various types of information about the CE device 95a and the mother board 95b are stored in the storage apparatus 180, a test operation may not be changed according to a type and characteristics of the CE device 95a or the mother board 95b. As a result, only one test apparatus is required, and thus expenses for the test operation may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A signal capture system comprising:
   a printed circuit board;
   a socket that is electrically connected to the printed circuit board and on which a reference memory component is mounted;
   an interposer that is mounted on the printed circuit board, is configured to be connected to the socket, an external apparatus, and a storage apparatus, the interposer being configured to receive first signals from the reference memory component and transmit the received first signals to the external apparatus and the storage apparatus, and the interposer being configured to receive second signals from the external apparatus and transmit the received second signals to the reference memory component and the storage apparatus;
   a separator configured to separate according to a channel the first signals and the second signals,
   wherein a shape of the socket is defined according to a type of the reference memory component,
   where the separator includes a signal information separator configured to separate a format, a level, and a timing of the first signal and the second signal.

2. The signal capture system of claim 1, wherein the external apparatus comprises a mother board or a customer end (CE) device.

3. The signal capture system of claim 1, further comprising:
   the storage apparatus, the storage apparatus being configured to store, according to a channel, the first signals and the second signals that are separated according to a channel,
   wherein the separator is connected between the interposer and the storage apparatus.

4. The signal capture system of claim 3, further comprising:
   a refiner configured to remove noise from the first signals and the second signals; and
   an amplifier configured to amplify the first signals and the second signals from which the noise is removed,
   wherein the refiner and the amplifier are connected between the interposer and the separator.

5. A signal capture system comprising:
   a printed circuit board;
   a socket that is electrically connected to the printed circuit board;
   an interposer that is mounted on the printed circuit board;
   an external apparatus that is connected to the interposer, the external apparatus being configured to generate a control signal for controlling a reference memory component mounted on the socket, the control signal instructing the reference memory component to read a data signal stored according to an address signal, or store the data signal according to the address signal; and
   a separator that is connected between the interposer and a storage apparatus, the separator being configured to separate the address signal, the data signal, and the control signal according to a channel,
   wherein the interposer is configured to transmit the address signal and the data signal from the reference memory component to the storage apparatus, and transmit the control signal from the external apparatus to the storage apparatus,
   wherein a shape of the socket is defined according to a type of the reference memory component,
   wherein the separator includes,
      a signal information separator configured to separate a format, a level, and a timing of the address signal, the data signal, and the control signal; and
      a demultiplexer configured to separate inputs according to a channel along a selection line, wherein the inputs include the address signal, the data signal, and the control signal, and
   wherein the storage apparatus is configured to store the format, the level, the timing, the address signal, the data signal, and the control signal, which are separated according to the channel.

6. The signal capture system of claim 5, wherein the external apparatus is a mother board, and the printed circuit board is mounted on the mother board.

7. The signal capture system of claim 5, wherein the external apparatus is a CE device, and the socket is mounted on the CE device.

8. The signal capture system of claim 7, wherein the printed circuit board is a flexible printed circuit board.

9. The signal capture system of claim 5, further comprising:
   the storage apparatus, the storage apparatus being connected to the separator.

10. The signal capture system of claim 9, further comprising:
    a refiner configured to remove noise from the address signal, the data signal, and the control signal; and
    an amplifier configured to amplify the address signal, the data signal, and the control signal from which the noise is removed, wherein the refiner and the amplifier are connected between the interposer and the separator.

11. The signal capture system of claim 9, further comprising:
    a transmitter connected between the separator and the storage apparatus.

12. The signal capture system of claim 11, wherein the transmitter comprises:
    at least one pair of general packet ratio service (GPRS) tunneling protocol (GTP) connectors configured to transmit a signal through a protocol defined in a GPRS network; and
    an optical cable connecting the at least one pair of GTP connectors to one another.

13. A test apparatus comprising:
    a signal capture system including a separator configured to receive and separate, according to a channel, first signals generated by a reference memory component and second signals generated by an external apparatus; and
    a storage apparatus that is connected to the separator, the storage apparatus being configured to store the first signals and the second signals separated according to a channel, wherein the first signals include an address signal and a data signal of the reference memory component, wherein the second signals include a control signal of the external apparatus, wherein the separator includes
- a signal information separator configured to separate a format, a level, and a timing of the address signal, the data signal, and the control signal; and
- a demultiplexer configured to separate inputs according to a channel along a selection line, wherein the inputs include the address signal, the data signal, and the control signal, wherein the storage apparatus is configured to store the format, the level, the timing, the address signal, the data signal, and the control signal, which are separated according to the channel.

14. The test apparatus of claim 13, further comprising:

a tester board configured to receive the first signals and the second signals stored in the storage apparatus according to a channel, and generate an operation signal by combining the first signals and the second signals as a group; and a header configured to apply the operation signal to a test memory component by receiving the operation signal from the tester board, and configured to receive an output signal processed by the test memory component, wherein the tester board is configured to receive the output signal from the header, and configured to determine whether an operation of the test memory component is normal by comparing the output signal with the first signals and the second signals.

15. The test apparatus of claim 13, further comprising:

a tester board configured to receive the format, the level, the timing, the address signal, the data signal, and the control signal stored according to the channel from the storage apparatus, and generate an operation signal by combining the address signal, the data signal, and the control signal as a group based on the format, the level, and the timing; and a header configured to apply the operation signal to the test memory component by receiving the operation signal from the tester board, and configured to receive an output signal processed by the test memory component, wherein the tester board is configured to receive the output signal from the header, and configured to determine whether an operation of the test memory component is normal by comparing the output signal with the address signal, the data signal, and the control signal.

* * * * *